Dec. 17, 1963
AKIHIKO SATO
3,114,847
SEMICONDUCTOR PULSE COUNTING DEVICE WITH GRADED LOW RESISTIVITY REGION SANDWICHED BETWEEN TWO HIGH RESISTANCE REGIONS
Filed Jan. 16, 1962
FIG. 1
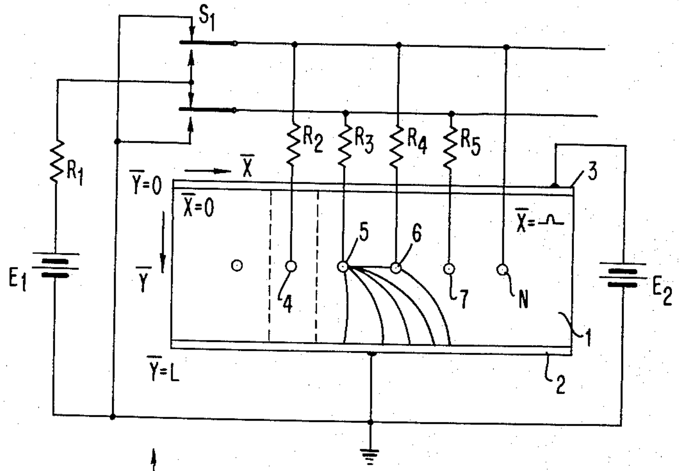
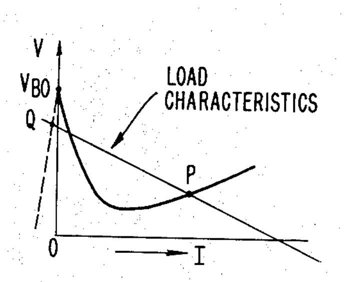
FIG. 2
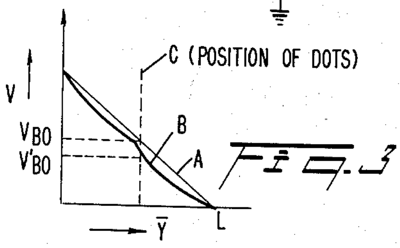
FIG. 3
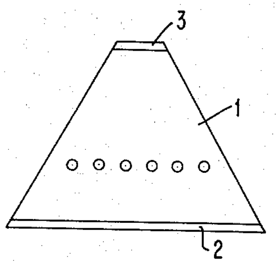
FIG. 4
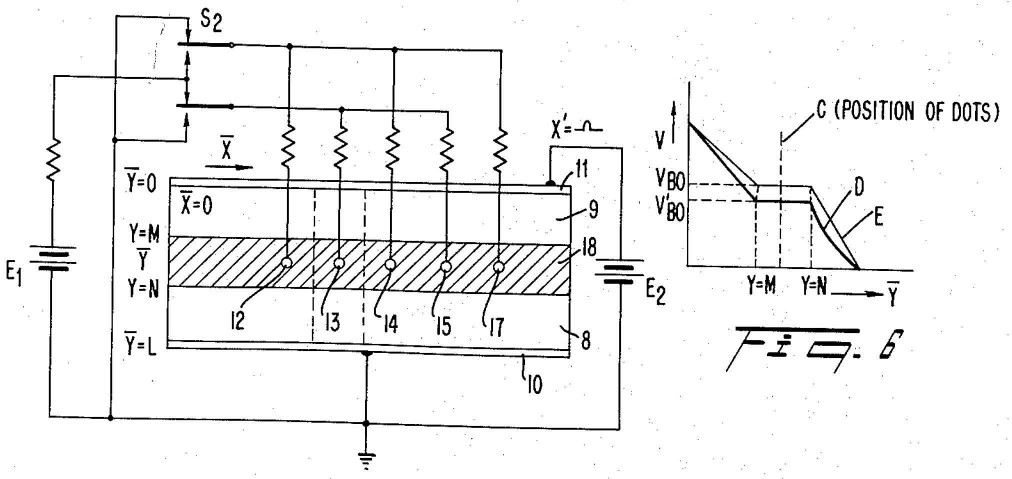
FIG. 6
FIG. 5
INVENTOR.
AKIHIKO SATO
BY Roy C. Hopgood
ATTORNEY

United States Patent Office 3,114,847
Patented Dec. 17, 1963

3,114,847

SEMICONDUCTOR PULSE COUNTING DEVICE WITH GRADED LOW RESISTIVITY REGION SANDWICHED BETWEEN TWO HIGH RESISTANCE REGIONS

Akihiko Sato, Tokyo, Japan, assignor to Nippon Electric Company Limited, Tokyo, Japan, a corporation of Japan Filed Jan. 16, 1962, Ser. No. 166,634
6 Claims. (Cl. 307—88.5)

This invention relates to a semiconductor pulse counting device which is adapted to step through a predetermined sequence of states in response to electrical input pulses. The invention is characterized by an improved semiconductor base structure that increases the accuracy, sensitivity, and reliability of the device. The invention can be used in many different types of electronic circuits, but it is particularly useful in counting circuits, switching circuits, frequency divider circuits, timing circuits, and the like.

The device of this invention is a solid state equivalent of a Dekatron counting tube, which is a multi-cathode glow tube that contains a plurality of cathodes disposed in a circle around a common anode. Electrical impulses applied to the tube cause a glowing spot to move successively around a circle of cathodes, one step per impulse received. The glowing cathode, of course, is conductive and all of the other cathodes are non-conductive. Therefore the position of the glow can be determined electrically by means of output resistors coupled in series with the cathodes. The glow current causes a potential drop across the corresponding output resistor, and the potential drop in turn indicates that the corresponding cathode is glowing.

A solid state equivalent of the Dekatron counting tube has been devised in the past, as described, for example, in my copending patent application Serial Number 59,542, which was filed on September 30, 1960, for a "Semiconductor Pulse Shifting Device." This prior art device contains a semiconductor base element on which a sequence of spaced rectifying junctions are formed. The rectifying junctions are adapted to have a negative resistance region like the characteristics of a double base diode, and the resistance of the base element is graduated to produce a potential gradient which extends along the sequence of rectifying junctions. When electrical input pulses are applied to the device, the rectifying junctions are broken down in sequence, as explained more fully in the above noted copending patent application, thus providing a counting sequence which is analogous to the counting sequence of a Dekatron tube.

Although this prior art solid state counting device performed its intended function, it had several serious limitations which were related to the transfer of carriers from one rectifying junction to the next rectifying junction in the sequence. These limitations, which will be discussed in detail in later paragraphs, effected the accuracy, sensitivity, and reliability of the device. Accordingly, the principal object of this invention is to provide an improved semiconductor pulse counting device which avoids the limitations of the prior art semiconductor pulse counting devices. Other objects and advantages of the invention will be apparent to those skilled in the art from the following description of one specific embodiment of the invention, as illustrated in the attached drawings, in which:

FIG. 1 is a schematic circuit diagram of a first prior art semiconductor pulse counting device;

FIG. 2 is the voltage-current characteristic curve of the device shown in FIG. 1;

FIG. 3 is the potential distribution curve of the device shown in FIG. 1;

FIG. 4 is a plan view of a second prior art semiconductor pulse counting device;

FIG. 5 is a schematic circuit diagram of the novel semiconductor pulse counting device of this invention; and FIG. 6 is the potential distribution curve of the device shown in FIG. 5.

FIG. 1 shows a prior art semiconductor pulse counting device such as disclosed in the above noted copending patent application. This prior art device comprises an N type semiconductor base element 1, a sequence of P-type dots 4, 5, 6 . . . N which are spaced along the N type base element 1 to form a sequence of rectifying junctions, and electrodes 2 and 3 which make ohmic contact with the base element 1. Each portion of base element 1 which contains one of the dots 4, 5, 6 . . . N, e.g. the portion shown by the dotted lines around dot 4, has the negative resistance characteristic of a double base diode, such as illustrated in the curve of FIG. 2. The semiconductor base element 1 has a graduated specific resistance which increases along the $\overline{X}$ direction in FIG. 1, i.e. along the row of rectifying junctions. Therefore, when a potential is applied between electrodes 2 and 3, a potential gradient is developed in the $\overline{X}$ direction of base element 1 in accordance with the following equation:

$$\Delta V=[KT/e].\log\ (\rho_\omega/\rho_0) \quad (1)$$

where $\Delta V$ is the potential difference between $\overline{X}=0$ and $\overline{X}=\omega$
$\rho_0$ is the specific resistance at $\overline{X}=0$
$\rho_\omega$ is the specific resistance at $\overline{X}=\omega$ is the charge of electron. This potential gradient acts to drive holes injected into base element 1 from dots 4, 5, 6 . . . N in the $\overline{X}$ direction of FIG. 1 as will be apparent to those skilled in the art.

The operation of this prior art device is best explained by means of a concrete example. Assume that switch $S_1$ is in the position indicated in FIG. 1 and dot 5 is in the "on" condition. The section including dot 5 exhibits the negative resistance characteristic of a double base diode, as shown by the characteristic curve of FIG. 2, where the straight line PQ is the load characteristic due to the resistor $R_3$ coupled to dot 5. It can be seen that dot 5 has two stable operating states which are defined by the points P and Q in FIG. 2. Operating point P is the "on" state and point Q is the "off" state. The holes injected into base element 1 from dot 5 always flow to the right in FIG. 1 due to the above described potential gradient, as illustrated by the solid streamlines extending between dot 5 and dot 6 in FIG. 1. The region below dot 6 is conductivity modulated by the flow of holes, which causes the potential of this portion of base element 1 to drop. No holes flow below dot 4, however, so there is no drop of potential below hole 4. Therefore, the breakdown voltage of the portion of base element 1 which contains dot 6 is reduced with respect to the breakdown voltage of the section including dot 4. This voltage reduction is illustrated in FIG. 3, which shows the potential gradient in the $\overline{Y}$ direction through base element 1. In FIG. 3, curve A shows the potential gradient in the $\overline{Y}$ direction through dot 4, and curve B shows the potential gradient in the $\overline{Y}$ direction through dot 6. $V_{BO}$ is the breakdown voltage of dot 4 under the above noted conditions, and $V'_{BO}$ is the breakdown voltage of dot 6. Dotted line C represents the physical location of dots 4 and 6.

Under the above noted conditions, assume that switch $S_1$ is thrown to the downward position. If the impressed voltage $E_1$ is greater than $V'_{BO}$ and less than $V_{BO}$, dot 6 will be above its breakdown voltage and dot 4 will be below its breakdown voltage. Therefore dot 6 will move to the "on" state while dot 4 will remain in the "off" state. Dot 5, of course, returns to the "off" state because of the switching action. In the downward position of switch $S_1$, the holes emitted by dot 6 are driven under dot 7 by the potential gradient, thereby lowering the breakdown potential of dot 7 so that it will switch to the "on" condition when switch $S_1$ is moved back up to the position shown in FIG. 1. Thus it can be seen that the "on" condition will move from left to right in FIG. 1 along the rectifying junctions, one step for each movement of switch $S_1$, in a manner analogous to the action of a Dekatron counting tube. And it should be noted that the input potential switching could be accomplished by a flip flop circuit rather than by a mechanical switch such as switch $S_1$, whereby this prior art device can be used to count a sequence of electrical input pulses rather than a sequence of switch movements.

It can be seen, from the foregoing description, that the action of this prior art device is based on a horizontal movement of holes, and therefore that accurate operation is impossible unless the movement of the holes is complete. However, in the above described device, the field which moves the holes is applied not only in the horizontal direction ($\overline{X}$ direction), but also in the vertical direction ($\overline{Y}$ direction). In the diagram of FIG. 3, this $\overline{Y}$ directional field is given as $E_{2/l}$ in terms of a one directional structure. Although there are some differences depending on design, this $\overline{Y}$ directional field is generally larger than the $\overline{X}$ directional field. Therefore, in the present invention, the above mentioned defect has been remedied by lowering the $\overline{Y}$ directional field to the same value as $\overline{X}$ directional field, thus ensuring a more complete movement of holes towards $\overline{X}$ direction. In order to lower the $\overline{Y}$ directional field, it is necessary either to decrease $E_2$ or to make the semiconductor in a fan-shape, that is, narrowing the side of the electrode 3 and broadening the side of the electrode 2 as shown in FIG. 4. However, the magnitude of $E_2$ cannot be reduced very far, because it must have a certain value with respect to the break voltage $V_{BO}$ in the circuit. Furthermore, when the semiconductor is made into a fan shape, the $\overline{Y}$ directional field becomes weaker as the position of the P-type dot comes nearer to the base line, that is, the wider side of the fan shape. But, on the other hand, the break voltage $V_{BO}$ is degenerated at the same time, and so the fan shape will not necessarily satisfy the requirements of the circuit. The object of this invention is to solve the foregoing problems without the disadvantages inherent in a fan shaped structure.

The pulse shifting device of this invention is characterized by the provision of a separate semiconductor zone in the $\overline{X}$ direction of the semiconductor base element along the rectifying junctions thereon. This separate semiconductor zone has a lower specific resistance than the other parts of the semiconductor base element, and its resistance varies in the $\overline{X}$ direction to produce a potential gradient to drive the holes from one rectifying junction to another. The function of this semiconductor zone in solving the above described problems will be best understood from the following description of one illustrative embodiment of the invention.

FIG. 5 shows an embodiment of the invention which is substantially identical to the prior art device of FIG. 1 with regard to circuit arrangement and voltage relationships. This embodiment of the invention, however, differs from the device of FIG. 1 by a separate semiconductor zone 18 between $Y=M$ and $Y=N$, which is indicated by the oblique lines in FIG. 5. Semiconductor zone 18 has a lower specific resistance than the adjacent semiconductor zones 8 and 9, and the resistance of zone 18 varies in the $\overline{X}$ direction to produce a potential gradient to drive the holes from one rectifying junction to another. Zones 8 and 9 are not necessarily of equal specific resistance, but they must be higher in specific resistance than zone 18 so as to produce a $\overline{Y}$ potential gradient such as shown in FIG. 6, which contrasts markedly with the prior art $\overline{Y}$ potential gradient shown in FIG. 3.

In the embodiment of FIG. 5, each section of the base element which contains a dot has a negative resistance characteristic as shown in FIG. 2. The basic operation of this embodiment is the same as in the prior art, but this invention provides a marked improvement over the prior art device due to the altered potential distribution shown in FIG. 6. This will be better understood by means of a concrete example. Assume that switch $S_2$ is in the position shown in FIG. 5 and that dot 13 is in the "on" condition, i.e. that it is operating at point P on the curve of FIG. 2. In this case, the holes injected by dot 13 will be swept under dot 14 by the potential gradient, thus lowering the breakdown potential of dot 13 with respect to the breakdown potential of dot 12. This is indicated by the curves in FIG. 6, in which curve D is the potential distribution in the $\overline{Y}$ direction through dot 14 under the above noted circumstances and curve E is the potential distribution in the $\overline{Y}$ direction through dot 12. $V_{BO}$ is the breakdown voltage of dot 12 and $V'_{BO}$ is the breakdown voltage of dot 14. The dotted line C indicates the physical location of the dots, and the dotted lines $Y=M$ and $Y=N$ indicate the physical boundaries of the low resistance semiconductor zone.

From the curves of FIG. 6, it will be apparent that the potential gradient in the $\overline{Y}$ direction is very low in the neighborhood of the dots due to the relatively low resistance of semiconductor section 18. By selecting the proper specific resistance for semiconductor section 18, the potential gradient in the $\overline{Y}$ direction can be made as low or lower than the potential gradient in the $\overline{X}$ direction, thus insuring much more complete movement of the holes in the $\overline{X}$ direction, and thereby substantially increasing the sensitivity, accuracy, reliability, and speed of operation of the device. In addition, since the specific resistance of zones 8 and 9 can be selected independent of the specific resistance of zone 18, the device of this invention provides much more freedom in adapting the total resistance between electrodes 10 and 11 to fit different applications of the circuit. Furthermore, since the total resistance between electrodes 10 and 11 can be made quite high without significantly effecting the movement of holes in the $\overline{X}$ direction, it will be obvious that the device of this invention also reduces the drain on voltage source $E_2$.

From the foregoing description it will be apparent that this invention provides a semiconductor pulse counting device which avoids the limitations of prior art semiconductor pulse counting devices. And it should be understood that this invention is by no means limited to the specific embodiment disclosed herein by way of example, since many modifications can be made in the disclosed structure without departing from the basic teaching of this invention. For example, the P-N junctions of this invention need not have the specific characteristic curve shown in FIG. 2; any characteristic curve which has a negative resistance region will be workable. Many other modifications of the disclosed structure will be apparent to those skilled in the art, and this invention includes all modifications falling within the scope of the following claims.

I claim:

1. A semiconductor device comprising a semiconductor base element containing a first semiconductor zone, a second semiconductor zone adjacent to said first semiconductor zone, and a third semiconductor zone adjacent to said second semiconductor zone, the specific resistance of said second semiconductor zone being lower than the specific resistance of said first and third semiconductor zones, a first electrode coupled to said first semiconductor zone, a second electrode coupled to said third semiconductor zone, a plurality of rectifying junctions spaced along said second semiconductor zone, and the specific resistance of said second semiconductor zone having a graduated value along said plurality of rectifying junctions.

2. The combination defined in claim 1 wherein said first, second, and third semiconductor zones all have the same conductivity type, and wherein said plurality of rectifying junctions are formed by a plurality of relatively small pieces of semiconductor material having the opposite conductivity type, said pieces of semiconductor material being attached in sequence to said second semiconductor zone.

3. The combination defined in claim 2 wherein each of said rectifying junctions is adapted to have a voltage-current characteristic curve containing a negative resistance region.

4. The combination defined in claim 3 in which said rectifying junctions are disposed along a line which is substantially parallel to said first and second electrodes.

5. A semiconductor pulse counting device comprising a semiconductor device as defined in claim 1, a first potential source coupled between said first and second electrodes, a plurality of impedances each coupled in series with a corresponding rectifying junction, and switch means adapted to apply a potential alternately to predetermined groups of said impedances.

6. The combination defined in claim 5 in which said rectifying junctions are divided into two groups in accordance with their position in said sequence, a first group comprising all even numbered junctions of said sequence, and a second group comprising all odd numbered junctions of said sequence, and wherein said switch means is adapted to apply a potential to said first group of junctions in one position thereof and to apply a potential to said second group of junctions in the other position thereof.

References Cited in the file of this patent

UNITED STATES PATENTS

| | | |
|---|---|---|
| 2,854,365 | Matare | Sept. 30, 1958 |
| 2,877,358 | Ross | Mar. 10, 1959 |

OTHER REFERENCES

"Double Negative Resistance Device," by R. F. Rutz in IBM Technical Disclosure Bulletin dated June 1959.